United States Patent
Mandell

(10) Patent No.: US 10,911,869 B2
(45) Date of Patent: Feb. 2, 2021

(54) VARIABLE-FREQUENCY SLIDING BAND EQUALIZATION FOR CONTROLLING SEALED LOUDSPEAKER EXCURSION

(71) Applicant: DOLBY LABORATORIES LICENSING CORPORATION, San Francisco, CA (US)

(72) Inventor: Douglas Mandell, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 16/606,589

(22) PCT Filed: Apr. 16, 2018

(86) PCT No.: PCT/US2018/027831
§ 371 (c)(1),
(2) Date: Oct. 18, 2019

(87) PCT Pub. No.: WO2018/194990
PCT Pub. Date: Oct. 25, 2018

(65) Prior Publication Data
US 2020/0137493 A1     Apr. 30, 2020

Related U.S. Application Data

(60) Provisional application No. 62/487,043, filed on Apr. 19, 2017.

(30) Foreign Application Priority Data

Apr. 19, 2017   (EP) ..................... 17166981

(51) Int. Cl.
*H04R 3/04* (2006.01)
*H03G 5/16* (2006.01)
*H04R 3/02* (2006.01)

(52) U.S. Cl.
CPC ............... *H04R 3/04* (2013.01); *H03G 5/165* (2013.01); *H04R 3/02* (2013.01)

(58) Field of Classification Search
None
See application file for complete search history.

(56) References Cited

U.S. PATENT DOCUMENTS

| 5,528,695 A | 6/1996 | Klippel |
| 5,548,650 A | 8/1996 | Clark |

(Continued)

FOREIGN PATENT DOCUMENTS

| CN | 103369447 | 10/2013 |
| EP | 1397024 | 3/2004 |

(Continued)

*Primary Examiner* — Qin Zhu

(57) ABSTRACT

Methods and systems for generating a speaker feed for driving a sealed speaker, including: generating feedback indicative of excursion of the speaker; in response to the feedback, equalizing an input signal to generate the speaker feed, such that the speaker feed is equalized for driving the speaker with: a desired frequency response above the speaker's resonance frequency; and an at least substantially flat frequency response in a variable sub-resonance equalization band without exceeding the speaker's excursion limit, where the sub-resonance equalization band extends from the resonance frequency down to a variable cutoff frequency, and the cutoff frequency is determined in response to the feedback. The speaker feed is generated in a feedback-controlled filter configured to boost the input signal at frequencies in the sub-resonance equalization band, the boost having a sloping frequency-amplitude response whose slope is set to overcome or cancel the speaker's natural falloff in the speaker's spring-loaded region.

28 Claims, 2 Drawing Sheets

(56) References Cited

U.S. PATENT DOCUMENTS

| | | |
|---|---|---|
| 6,865,274 B1 | 3/2005 | Aarts |
| 8,019,088 B2 | 9/2011 | Holman |
| 9,319,789 B1 | 4/2016 | Nielsen |
| 9,807,502 B1 * | 10/2017 | Hatab ............... H04R 3/04 |
| 2005/0094829 A1 * | 5/2005 | Cordell ............. H04R 3/08 |
| | | 381/103 |
| 2006/0153403 A1 * | 7/2006 | Lechner ............ H04R 3/00 |
| | | 381/102 |
| 2007/0172081 A1 | 7/2007 | Oxford |
| 2008/0175397 A1 * | 7/2008 | Holman ............. H04R 3/08 |
| | | 381/55 |
| 2012/0179456 A1 | 7/2012 | Ryu |
| 2013/0230191 A1 | 9/2013 | Hoang Co Thuy |
| 2014/0341394 A1 | 11/2014 | Croft, III |
| 2016/0249135 A1 * | 8/2016 | Savvopoulos ..... H04R 3/007 |

FOREIGN PATENT DOCUMENTS

| | | |
|---|---|---|
| EP | 3026930 | 6/2016 |
| WO | 2008115875 | 9/2008 |

\* cited by examiner

VARIABLE-FREQUENCY SLIDING BAND EQUALIZATION FOR CONTROLLING SEALED LOUDSPEAKER EXCURSION

CROSS-REFERENCE TO RELATED APPLICATION

This application claims the benefit of priority to U.S. Provisional Application No. 62/487,043 and European Patent Application No. 17166981.5, both filed on 19 Apr. 2017, which are incorporated herein by reference.

TECHNICAL FIELD

This disclosure relates to audio signal processing. Some embodiments pertain to generating speaker feeds for driving a sealed speaker at frequencies below its resonance frequency (e.g., with substantially flat frequency response in as wide a range of sub-resonance frequencies as possible) without exceeding the speaker's excursion limit, in response to feedback indicative of speaker excursion. Some embodiments are methods for equalizing an input signal to generate a signal for driving a sealed speaker with a desired (e.g., flat) frequency response in a frequency range without exceeding the speaker's excursion limit, where the range extends below the speaker's resonance frequency to a variable, feedback-determined sub-resonance frequency, and where the range preferably also extends up above the resonance frequency.

BACKGROUND

Herein, the expression "excursion limit" of a speaker (or a driver included in a speaker) is used to denote a limit on amplitude of physical displacement of at least one moving element of a driver of the speaker during operation (i.e., while the driver is being driven by a speaker feed). It is typically important to drive a speaker without exceeding the excursion limit of a speaker (or the excursion limit of each driver of the speaker) to prevent over-excursion causing physical damage to the speaker and/or unacceptable distortion of sound emitted from the speaker.

Herein, the expression "maximum output level" of a speaker (or a driver included in a speaker) denotes the maximum sound pressure level of sound that can be emitted from the speaker without driving the speaker into over-excursion. Thus, a speaker operating at an output level which is less than the maximum output level is being driven so that the peak sound pressure level of sound emitted from the speaker is less than the maximum sound pressure level of sound that can be emitted without driving the speaker into over-excursion.

Herein, the expressions "resonance frequency" and "resonant frequency" (of a speaker) are used as synonyms, and the expression "sub-resonance frequency" is used to denote a frequency, at which a speaker may be driven, which is below the speaker's resonance frequency. Also herein, the expression "sealed speaker" is used to denote a speaker having a sealed enclosure, and the expression "ported speaker" is used to denote a speaker having a ported enclosure.

A speaker may include a single driver or multiple drivers. Since a single driver in a speaker enclosure has a particular, physically-determined excursion limit, a speaker which includes multiple drivers in an enclosure has (in the general case in which each driver has different characteristics) multiple excursion limits: one for each of the drivers. Thus, in some embodiments of the present invention in which a speaker includes N drivers (where N is an integer greater than one), N speaker feeds are generated (each in accordance with the invention). One speaker feed is generated for each driver (i.e., multiple speaker feeds are generated for a speaker having multiple drivers). Such embodiments are appropriate where the low-frequency characteristics of the drivers in a single speaker do not closely match each other. However, in some other embodiments of the invention (e.g., in cases in which a speaker has multiple drivers whose low-frequency characteristics match sufficiently closely), a single speaker feed is generated (in accordance with the invention) for all the drivers of one speaker whose low-frequency characteristics match sufficiently closely (e.g., one speaker feed may be generated for the speaker).

To a first approximation, the acoustic response of a sealed speaker (i.e., of a driver within a sealed speaker) is approximately flat above its resonance frequency, and falls (starting at the speaker's resonance frequency) with decreasing frequency, starting at a rate substantially equal to a 12 dB/octave ("2-pole") rate. At output levels less than or equal to the maximum output level, it is typically considered that the best possible frequency response (of a sealed speaker) is one that is essentially flat down to resonance and then falls at a rate equal (or substantially equal) to a 2-pole rate with falling frequency below the resonant frequency. The inventor has recognized that at an output level less than the maximum output level (i.e., when driving the speaker so that the peak sound pressure level of sound emitted from the speaker is less than the maximum sound pressure level of sound that can be emitted from the speaker without driving the speaker into over-excursion), it is often desirable to drive a sealed speaker so as to achieve a frequency response which is a "best" frequency response in the sense that is essentially flat down to resonance and also from the resonant frequency down to a level-determined sub-resonance frequency, and then falls at a rate equal (or substantially equal) to a 2-pole rate with falling frequency below the level-determined sub-resonance frequency.

The acoustic response of a ported speaker (i.e., of a driver within a ported speaker) typically falls (starting at the speaker's resonance frequency) with decreasing frequency much faster than does the acoustic response of a sealed speaker. To a first approximation, the acoustic response of a ported speaker typically falls (starting at the resonance frequency) with decreasing frequency, starting at a rate equal (or substantially equal) to a 24 dB/octave ("4-pole") rate.

In a range of frequencies starting at resonant frequency and extending down from the resonant frequency to a minimum frequency, the maximum output level of a sealed speaker as a function of frequency (i.e., maximum sound pressure level of sound, as a function of frequency of the sound, that can be emitted from the speaker without driving the speaker into over-excursion) has exactly the same shape as the speaker's frequency response, since in this frequency range (sometimes referred to as the "spring-loaded region") the output level is limited by the maximum excursion of the speaker cone. For example, this is true of the spring-loaded region of curve A of FIG. 1. Curve A (also shown in FIG. 2) is the frequency response of a sealed speaker being driven at maximum output level, and where the spring-loaded region of the speaker's response is the frequency range from the resonant frequency (indicated in FIGS. 1 and 2) down to a minimum frequency, $F_{min}$.

FIG. 1 is a graph in which vertical distance above the horizontal axis indicates sound pressure level, and increasing horizontal distance to the right of the vertical axis indicates increasing frequency above minimum frequency, $F_{min}$. In FIG. 1, curve A indicates maximum output level of a sealed speaker as a function of frequency over a range extending from above the speaker's resonant frequency down to minimum frequency, $F_{min}$, in response to a speaker feed (e.g., a sinusoidal speaker feed whose frequency is swept through the range of frequencies down to the minimum frequency and which has a peak amplitude at each frequency in the range which is the largest possible without driving the speaker into over-excursion at such frequency; or a speaker feed having frequency components, each of which has peak amplitude which is maximal in the sense of being the largest possible without driving the speaker into over-excursion, at frequencies in the range).

The inventor has recognized that it is desirable to operate a sealed speaker so as to realize the advantage of accurately reproducing frequencies lower than the resonant frequency (without driving the speaker into over-excursion), and that what is needed to so operate the speaker is an equalizer whose response changes with maximum excursion of the speaker such that it stays within the excursion limit(s) of the speaker system, and yet generates an equalized speaker feed for driving the speaker with a flat (or substantially flat) response over a variable sub-resonance frequency band (this band is variable in that it has width from the resonant frequency down to a variable, feedback-determined frequency). The inventor has also recognized that this variable width is preferably determined by feedback indicative of peak speaker excursion (e.g., feedback indicative of peak level or some other measured characteristic of frequency components of the equalized speaker feed in the spring-loaded region), and preferably should be as wide as possible without causing over-excursion.

Since the excursion required of a loudspeaker's cone to produce a particular sound pressure level is inversely proportional to the square of frequency, substantially larger cone excursion is required to reproduce low frequencies than high frequencies. Thus for any given audio signal being reproduced by a speaker, the lowest frequencies determine, for the most part, the cone excursion. This excursion is limited by physical properties of the speaker, and it is highly desirable to avoid driving the speaker into over-excursion. One conventional method of preventing over-excursion is the use of a feedback limiter in which feedback indicative of some version of the signal driving a loudspeaker is generated, and if the level of the feedback is determined to exceed a threshold, the input gain to the system is reduced in order to prevent over-excursion. However, such method unnecessarily reduces signals that could have been reproduced by the speaker.

It is also conventional to use a variable-frequency (sliding) highpass filter in connection with equalization of a speaker's response, including by using feedback indicative of a characteristic of some version of a speaker feed signal to control the sliding highpass filter. However, until the present invention, feedback-controlled equalization had not been used to generate a speaker feed for driving a sealed speaker with flat or substantially flat equalized response in a band extending below resonance, where the width of the band below resonance is varied in response to feedback indicative of speaker excursion or speaker feed level (e.g., to make the band as wide as possible without allowing over-excursion).

It is also conventional to selectively include in (or remove from) a speaker feed, in response to feedback (e.g., indicative of level of the speaker feed), a predetermined band of sub-resonance frequencies, where the band has a fixed, predetermined width and a maximum frequency which is the resonant frequency of the speaker to be driven. However, this approach has a number of limitations and disadvantages, including that it may remove more (e g, many more) sub-resonance frequencies than necessary to protect the speaker, and would typically not achieve a best possible frequency response (e.g., a response which is at least substantially flat over a widest possible frequency range) while also protecting the speaker.

In accordance with some embodiments of the present invention, rather than simply varying gain of an input signal (e.g., in response to feedback) in a manner changing the level of (or selectively removing) frequency content of the input signal at all frequencies (or all frequencies below a cutoff frequency, or in a predetermined band of frequencies), an equalizer is controlled (e.g., by adjusting a second-order equalization filter's parameters in response to feedback) so as to boost the gain applied to sub-resonance frequencies of an input signal (relative to the gain applied to higher frequency components of the input signal) to generate a speaker feed for reproducing (e.g., with flat equalized frequency response) as much of the input signal as possible without allowing over-excursion (e.g., for reproducing as many frequency components of the input signal as possible, including in as wide a range of sub-resonance frequencies as possible, without unnecessarily reducing gain of sub-resonance frequency components and without allowing over-excursion).

SUMMARY OF EMBODIMENTS

The inventor has recognized that with the availability of relatively inexpensive DSP (digital signal processing), it should be possible to equalize a sealed speaker (e.g., a small, sealed, powered subwoofer or other small, sealed speaker) to enable use of more of the speaker's available ability to reproduce sound without exceeding the speaker's excursion limit(s). In particular, the inventor has recognized that it is possible to equalize the frequency response of a sealed speaker so that the speaker operates with flat or substantially flat frequency response in a range extending substantially below (as well as substantially above) its resonant frequency and without exceeding the speaker's excursion limit(s). Such an equalizer must, of course, take into account the physical limitations of each driver/enclosure combination of the speaker.

In a class of embodiments of the invention, an equalizer generates a speaker feed for driving a sealed speaker at frequencies in a range including frequencies below its resonance frequency, without exceeding the speaker's excursion limit, where the range extends, and has a variable width, below resonance (e.g., extends below the resonance frequency to a variable, feedback-determined sub-resonance frequency). The range is preferably as wide as possible while preventing over-excursion of the speaker, and preferably also extends above the resonance frequency. Preferably, the speaker feed is generated so as to equalize the speaker's response over the range, so that the equalized response is at least substantially flat in the range. Typically, the speaker feed is generated in response to feedback proportional to, or otherwise indicative of, speaker excursion at at least one sub-resonance frequency (e.g., the feedback is indicative of peak amplitude of frequency content of the speaker feed in a range of sub-resonance frequencies of the speaker, where such peak amplitude may be indicative of peak excursion of the speaker in the spring-loaded region). Some embodiments are methods for equalizing an input signal to generate an equalized signal for driving a sealed speaker (e.g., a sealed subwoofer) with an at least substantially flat frequency response in a frequency range without exceeding the speaker's excursion limit, where the range extends with variable width below the speaker's resonance frequency to a feedback-determined sub-resonance frequency (where the variable width is preferably as wide as possible, e.g., at least substantially equal to one and a half octaves below resonance in some cases, while preventing over-excursion), and where the range preferably also extends up to an upper frequency above the resonance frequency.

A first example embodiment is a method for generating a speaker feed (where the speaker feed may be an equalized signal generated by equalizing an input signal) for driving a sealed speaker (or another speaker having a slow falloff, e.g., a falloff at a 2-pole rate, from its resonance frequency down to a minimum frequency). The speaker feed is generated so as to have the following characteristics:

(a) it is equalized for driving the speaker with a desired frequency response above the resonance frequency (e.g., a frequency response which is at least substantially flat, or as flat as is practically achievable, above the resonance frequency); and (b) it is equalized for driving the speaker with a desired frequency response in a variable sub-resonance equalization band (typically, a frequency response which is at least substantially flat, or as flat as is practically achievable, in the sub-resonance equalization band) without exceeding the speaker's excursion limit, where the sub-resonance equalization band extends from the resonance frequency down to a variable cutoff frequency, and where the cutoff frequency is controlled by (i.e., determined in response to) a feedback signal indicative of speaker excursion (e.g., the feedback signal is indicative of peak level of frequency content of the equalized speaker feed in a range of sub-resonance frequencies). Typically, the cutoff frequency is determined in response to the feedback signal such that the sub-resonance equalization band is as wide (i.e., the cutoff frequency is as low) as possible. Typically, the feedback signal is indicative of peak level of frequency content of the equalized speaker feed in a range of sub-resonance frequencies (e.g., in the spring-loaded region) and the width of the sub-resonance equalization band is a decreasing function of (e.g., is inversely proportional to) said peak amplitude. Typically, the equalization includes boosting of the input signal at frequencies in the sub-resonance equalization band, with the boost having a sloping frequency-amplitude response (where the slope is set to overcome or cancel the speaker's slow (e.g., "2-pole") natural falloff in the speaker's spring-loaded region), to achieve an equalized speaker feed having frequency-amplitude spectrum which is flat or substantially flat (e.g., as flat as practically achievable) in the sub-resonance equalization band.

Typically, the speaker feed is generated so as to be suitable for driving the speaker with a frequency response which naturally falls off (e.g., at a "2-pole" rate) below the sub-resonance equalization band. Typically, this is achieved by boosting the input signal by a lesser amount (e.g., not boosting it, or not applying equalization to it) at frequencies below the sub-resonance equalization band (e.g., without equalizing frequency components of the input signal having frequencies below the sub-resonance equalization band).

A typical embodiment of the invention generates an equalized speaker feed for driving a small, sealed speaker (e.g., a sound bar intended for use as a subwoofer), e.g., a small, sealed speaker having resonant frequency equal to about 67 Hz.

Typical embodiments of the invention allow use of a speaker substantially below its resonance (e.g., by generating a speaker feed for driving a sealed subwoofer with an at least substantially flat response down to at least one and one half (1 and ½) octaves below resonance).

In typical embodiments of the invention, equalizing the input signal to generate the speaker feed includes implementing a biquadratic function with a complex pair of poles at a controllable frequency and a complex pairs of zeros chosen to at least substantially cancel the poles that form the speaker's resonance, and setting the controllable frequency to the cutoff frequency. For example, the method may include adjusting the controllable frequency based on the feedback signal.

Other aspects of the invention include systems and apparatus (e.g., an equalizer) configured to perform any embodiment of the inventive method.

These and other embodiments and aspects are detailed below with particularity.

NOTATION AND NOMENCLATURE

Throughout this disclosure including in the claims, the following expressions and terms have the following definitions:

the terms "speaker" and "loudspeaker" are used synonymously to denote any sound-emitting transducer. This definition includes loudspeakers implemented as multiple transducers (e.g., woofer and tweeter in a single speaker enclosure);

the expression "speaker feed" is used to denote an audio signal to be applied directly to a loudspeaker, or an audio signal that is to be applied to an amplifier and loudspeaker in series;

the term "channel" (or "audio channel") is used to denote a monophonic audio signal;

the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon);

the expression "system" is used in a broad sense to denote a device, system, or subsystem. For example, a subsystem that implements processing may be referred to as a processing system, and a system including such a subsystem (e.g., a system that generates multiple output signals in response to X inputs, in which the subsystem generates M of the inputs and the other X−M inputs are received from an external source) may also be referred to as a processing system; and the term "couples" or "coupled" is used to mean either a direct or indirect connection. Thus, if a first device couples to a second device, that connection may be through a direct connection, or through an indirect connection via other devices and connections.

DESCRIPTION OF EXAMPLE EMBODIMENTS

Figure 1:
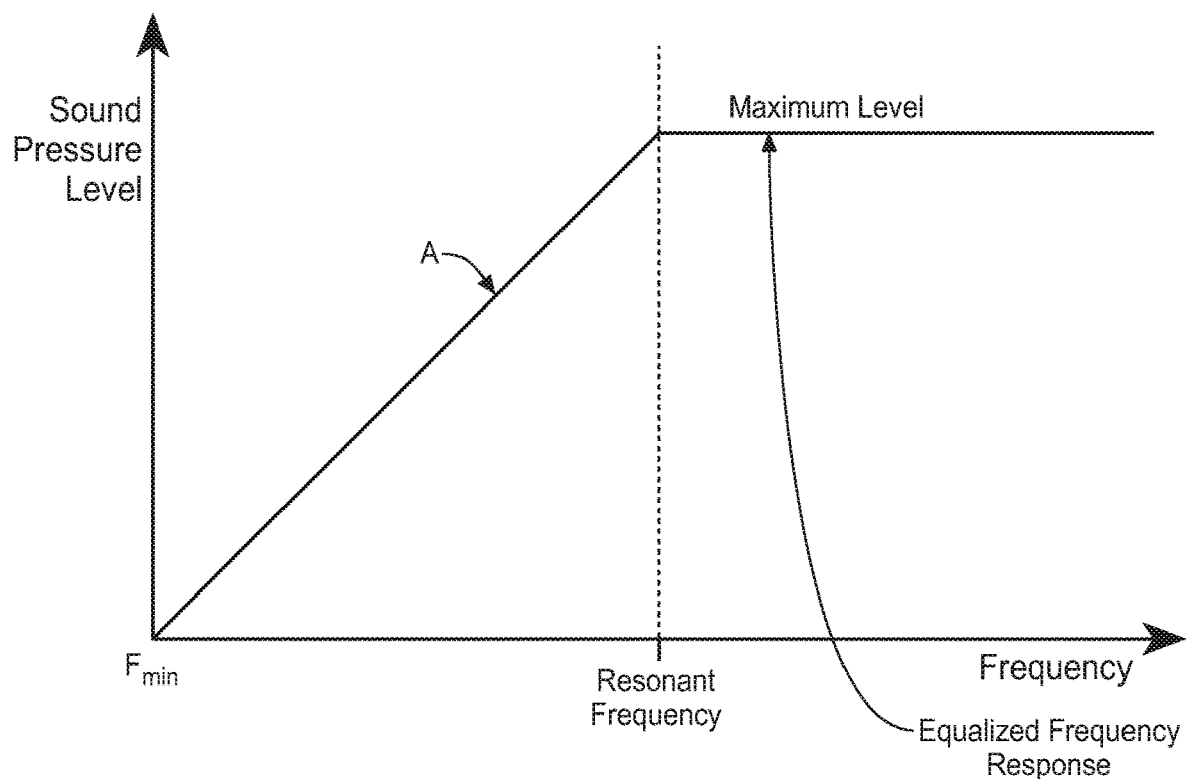
FIG. 1 is a graph, in which curve A indicates maximum output level of a sealed speaker (the output level which is the largest possible without driving the speaker into over-excursion) as a function of frequency over a range extending from above the speaker's resonant frequency down to minimum frequency, $F_{min}$, in response to a speaker feed.
Figure 2:
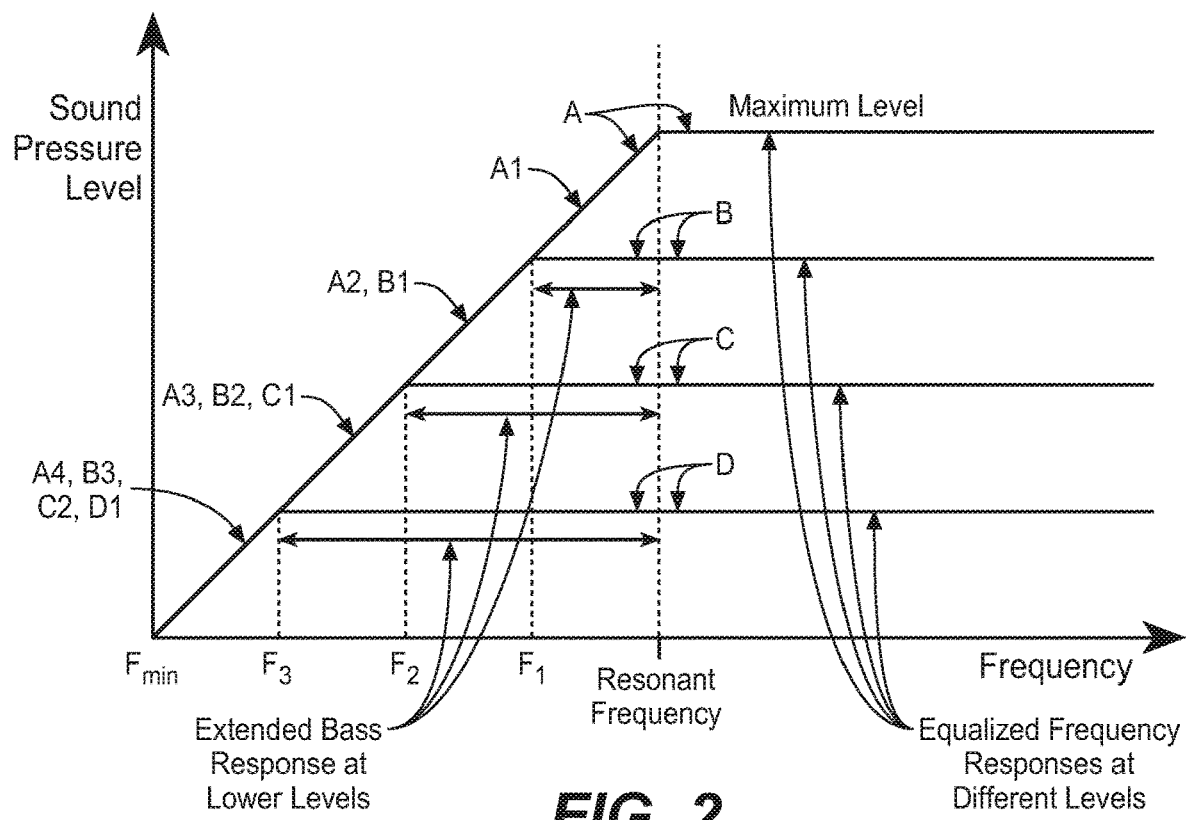
FIG. 2 is a graph in which each of curves A, B, C, and D indicates output level of a sealed speaker (achieved without exceeding the speaker's excursion limit, and thus without driving the speaker into over-excursion) as a function of frequency, when the speaker is driven by an equalized speaker feed generated in accordance with an embodiment of the invention. Graph A of FIG. 2 is identical to graph A of FIG. 1.
Figure 3:
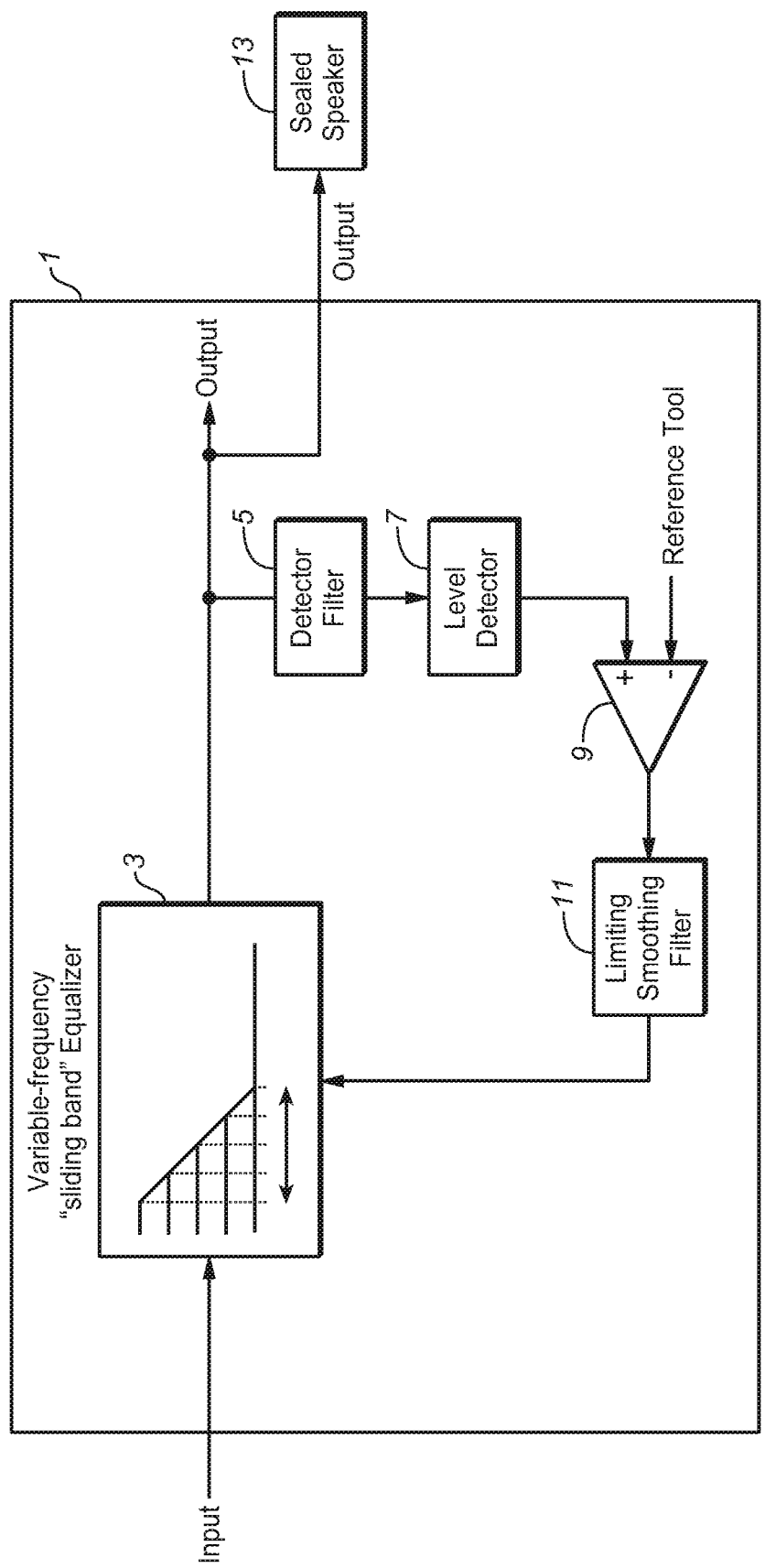
FIG. 3 is a block diagram of an embodiment of the inventive equalization system.

Examples of embodiments of the invention are described herein with reference to FIGS. 1, 2, and 3.

As noted above with reference to FIG. 1, in the spring-loaded region (starting at resonant frequency and extending down to a minimum frequency), the maximum output level of a sealed speaker as a function of frequency (i.e., maximum sound pressure level of sound, as a function of frequency of the sound, that can be emitted from the speaker without driving the speaker into over-excursion) has exactly the same shape as the speaker's frequency response. This is true of curve A of FIG. 1, in the spring-loaded region from the indicated resonance frequency down to minimum frequency, $F_{min}$. Curve A indicates maximum output level of a sealed speaker as a function of frequency over a range including the speaker's resonance frequency down to minimum frequency, $F_{min}$, in response to a speaker feed.

FIG. 2 is a graph of four curves: curve A (which is shown in FIG. 1 as well as in FIG. 2 and has been described with reference to FIG. 1), and curves B, C, and D. Each of the curves indicates output level of a sealed speaker as a function of frequency from the minimum frequency (below resonance) up to an upper frequency (above resonance). Curve A is flat above the speaker's resonant frequency; curve B is flat above the speaker's resonant frequency and in a sub-resonance equalization band from the resonant frequency down to sub-resonance frequency $F_1$; curve C is flat above the speaker's resonant frequency and in a sub-resonance equalization band from the resonant frequency down to sub-resonance frequency $F_2$; and curve D is flat above the speaker's resonant frequency and in a sub-resonance equalization band from the resonant frequency down to sub-resonance frequency $F_3$.

In FIG. 2, vertical distance above the horizontal axis indicates sound pressure level, and increasing horizontal distance to the right of the vertical axis indicates increasing frequency above minimum frequency, $F_{min}$.

In accordance with some embodiments of the invention, an equalized speaker feed is generated to be suitable for driving a sealed speaker with an equalized response which is at least substantially flat in a sub-resonance equalization band (e.g., that of curve B, C, or D). In such embodiments, the low frequency limit (cutoff frequency) of the sub-resonance equalization band is determined to be as low as possible (e.g., by determining an equalizer's equalization setting in response to feedback) subject to the constraint that the speaker does not reach over-excursion when driven by the equalized speaker feed. Typically, all the available equalization settings boost an input signal at frequencies in the sub-resonance equalization band so that the resulting equalized signal (equalized speaker feed) can drive the speaker with an equalized response which is flat (i.e., as flat as is practical to achieve) in the sub-resonance equalization band. To determine the best equalization setting, a mapping is implemented between a measured equalized speaker feed level (in at least a sub-range of the sub-resonance equalization band) and a corresponding one of the available settings. The "best" equalization setting is typically the one that boosts sub-resonant frequencies of the input signal from the resonant frequency down to the lowest sub-resonance frequency (i.e., corresponds to the sub-resonance equalization band with the lowest cutoff frequency) that achieves a desired (e.g., flat) equalized response down to such sub-resonance frequency without causing over-excursion, and does not boost sub-resonant frequencies of the input signal below this lowest sub-resonance frequency enough to cause over-excursion. Each equalization setting (e.g., each setting in a range from "zero" to "Maximum" boost) typically corresponds to a feedback-determined level of the equalized signal. Typically, this level is indicative of (e.g., proportional to) maximum excursion of the speaker (e.g., peak level of a frequency component of the equalized signal is measured in a range below resonance frequency, and this peak level is indicative of maximum excursion of the speaker).

The inventor has recognized that when driving a sealed speaker at an output level less than the maximum output level (e.g., at the greatest output level indicated by curve B, or the greatest output level indicated by curve C, or the greatest output level indicated by curve D), it is often desirable to drive the sealed speaker so as to achieve a frequency response which is the best possible frequency response in the sense that:

it is at least substantially flat (at the sub-maximal output level) from an upper frequency down to resonance, and also, below resonance, in a sub-resonance equalization band down to a level-determined sub-resonance frequency; and at frequencies below the sub-resonance equalization band, it naturally falls off (e.g., at the 2-pole rate of the sealed speaker of indicated by curves A, B, C, and D of FIG. 2) with falling frequency.

In a class of embodiments of the invention, an equalizer (e.g., an implementation of equalizer 1 of FIG. 3) generates an equalized speaker feed (e.g., the output signal of FIG. 3) for driving a sealed speaker with an equalized frequency response (preferably, an equalized frequency response which is at least substantially flat) in a sub-resonance range including frequencies below its resonance frequency, without exceeding the speaker's excursion limit, where the sub-resonance range extends (with a variable width), below the speaker's resonance frequency to a feedback-determined sub-resonance frequency. The sub-resonance range is preferably as wide as possible while preventing over-excursion of the speaker. Preferably, the equalized speaker feed is generated to drive the speaker with a desired equalized frequency response (preferably, an equalized frequency response which is at least substantially flat) at frequencies above the resonance frequency. Typically, the equalized speaker feed is generated in response to feedback (e.g., the feedback generated by elements 5, 7, 9, and 11 of FIG. 3) proportional to, or otherwise indicative of, the maximum speaker excursion which would result from driving the speaker with the equalized speaker feed.

An example embodiment in this class will be described with reference to FIG. 2. The example embodiment is a method for equalizing an input signal to generate an equalized signal for driving a sealed speaker (or another speaker having a slow falloff, e.g., a falloff at a 2-pole rate, from its resonance frequency down to a minimum frequency) with an at least substantially flat frequency response in a sub-resonance frequency band, and without exceeding the speaker's excursion limit, where the sub-resonance range extends with variable width below the speaker's resonance frequency to a feedback-determined sub-resonance frequency (e.g., an equalized signal for driving the speaker with the frequency response indicated by curve B, C, or D of FIG. 2, with the choice of curve B, C, or D determined by feedback indicative of speaker excursion). This variable width varies with peak level of the equalized signal (e.g., the peak level of the largest-amplitude frequency component thereof, in the frequency range below resonant frequency), but at any time during generation of the equalized signal, is preferably as wide as possible while preventing over-excursion. The sub-resonance range in which the speaker's frequency response (when driven by the equalized signal) is preferably flat (or as flat is practical to achieve). Preferably, the equalized signal is generated to be sufficient to drive the speaker with a desired equalized frequency response (preferably, an equalized frequency response which is at least substantially flat) at frequencies above the resonance frequency (e.g., up to an upper frequency above the resonance frequency).

In the example embodiment, the equalized signal is generated for use as a speaker feed for driving a speaker (of the noted type) having a resonant frequency (e.g., for driving the speaker with the frequency response indicated by curve B, C, or D), in such a manner that the equalized signal has the following characteristics:

(a) it is equalized for driving the speaker with a desired frequency response above the resonance frequency (e.g., a frequency response above the resonant frequency which is at least substantially flat or as flat as is practically achievable, as is the equalized frequency response corresponding to each of curves B, C, or D, above the indicated resonant frequency); and (b) it is equalized for driving the speaker with a desired frequency response in a variable sub-resonance equalization band (typically, a frequency response in the sub-resonance equalization band which is at least substantially flat, or as flat as is practically achievable) without exceeding the speaker's excursion limit, where the sub-resonance equalization band extends from the resonance frequency down to a variable cutoff frequency, and where the cutoff frequency is controlled so that the sub-resonance equalization band is as wide as possible in response to feedback (e.g., feedback indicative of signal level). Examples of equalized signals which have been so equalized in such a sub-resonance equalization band include: the equalized signal corresponding to curve B in the sub-resonance equalization band from the resonant frequency down to frequency $F_1$, the equalized signal corresponding to curve C in the sub-resonance equalization band from the resonant frequency down to frequency $F_2$, and the equalized signal corresponding to curve D in the sub-resonance equalization band from the resonant frequency down to frequency $F_3$. The width of the sub-resonance equalization band is variable, and is controlled so as to be as wide as possible in response to feedback (e.g., feedback indicative of the peak level of the equalized signal). For example, when the width of the sub-resonance equalization band is controlled in response to feedback indicative of peak level of the equalized signal (e.g., the peak level of the largest-amplitude frequency component of curve B, C, or D, in the frequency range below the resonant frequency), the sub-resonance equalization band has a first width (from the resonant frequency to frequency $F_1$) in response to the equalized signal having the peak level of curve B, the sub-resonance equalization band has a greater width (from the resonant frequency to frequency $F_2$) in response to the equalized signal having the (relatively lower) peak level of curve C, and the sub-resonance equalization band has an even greater width (from the resonant frequency to frequency $F_3$) in response to the equalized signal having the (even lower) peak level of curve D. Typically, this is achieved by boosting the input signal at frequencies in the sub-resonance equalization band, with the boost having a sloping frequency-amplitude response (where the slope is set to overcome or cancel the speaker's slow (e.g., "2-pole") natural falloff in the spring-loaded region below the resonance frequency) to achieve an equalized speaker feed for driving the speaker with a response which is as flat as practically achievable above the cutoff frequency of the sub-resonance equalization band. To generate the equalized signal (e.g., one corresponding to curve B, C, or D), an input signal (e.g., the signal input to element 3 of FIG. 3) is boosted (e.g., by equalizer element 3 of FIG. 3) at frequencies in the sub-resonance equalization band, with the boost having a sloping frequency response (where the slope is set to overcome or cancel the speaker's slow (e.g., "2-pole") natural falloff in the spring-loaded region below the resonant frequency), so as to achieve an equalized speaker feed (e.g., the output of element 3 of FIG. 3) for driving the speaker with a response which is as flat as is practically achievable above the cutoff frequency of the sub-resonance equalization band; and (c) it is generated for driving the speaker with a frequency response which naturally falls off (e.g., at a "2-pole" rate) with decreasing frequency below the sub-resonance equalization band. Typically, this is achieved by boosting the input signal by a lesser amount (e.g., not boosting it) at frequencies below the sub-resonance equalization band. For example, the equalized signal corresponding to curve B can drive the speaker with a frequency response which falls at a natural (2-pole) rate below the lowest frequency ($F_1$) of its sub-resonance equalization band, the equalized signal corresponding to curve C can drive the speaker with a frequency response which falls at a natural (2-pole) rate below the lowest frequency ($F_2$) of its sub-resonance equalization band, and the equalized signal corresponding to curve D can drive the speaker with a frequency response which falls at a natural (2-pole) rate below the lowest frequency ($F_3$) of its sub-resonance equalization band. To generate the equalized signal corresponding to curve B, C, or D, frequency components of an input signal (e.g., the signal input to equalizer 1 of FIG. 3) below the sub-resonance equalization band are not boosted (e.g., by equalization filter 3 of FIG. 3) or are boosted (e.g., by equalization filter 3 of FIG. 3) by a lesser amount than are frequency components in the sub-resonance equalization band.

In accordance with the example embodiment, an equalized speaker feed (e.g., of a type corresponding to curve B, C, or D of FIG. 2) can be generated (by equalizing an input signal) to drive a speaker of the noted type with level(s) that do not exceed a peak output level for the relevant curve (e.g., the peak level of curve B, C, or D), where the peak output level is less than the maximum output level corresponding to curve A, so that the speaker does not reach over-excursion. The equalized speaker signal is generated by boosting the input signal at frequencies in the sub-resonance equalization band (e.g., from frequency $F_3$ to the resonant frequency for curve D, from frequency $F_2$ to the resonant frequency for curve C, or from frequency $F_1$ to the resonant frequency for curve B), with the boost having a sloping frequency-amplitude response (where the slope is set to overcome or cancel the speaker's natural (e.g., 2-pole) falloff below the resonant frequency), so that the equalized speaker feed has frequency-amplitude spectrum which is as flat as practically achievable in the sub-resonance equalization band. The equalized speaker signal can be generated without boosting the input signal at frequencies below the sub-resonance equalization band (e.g., below frequency $F_3$ for curve D, below frequency $F_2$ for curve C, or below frequency $F_1$ for curve B), or by boosting the input signal at frequencies below the sub-resonance equalization band by less than the input signal is boosted at frequencies in the sub-resonance equalization band, and thus the frequency response of the speaker driven by the equalized speaker feed is allowed to fall (with decreasing frequency) at frequencies below the sub-resonance equalization band at the natural (e.g., 2-pole) rate. Generation of frequency components of the equalized speaker signal (for frequencies above resonance) is accomplished by equalizing the input signal (at frequencies above resonance) so that the equalized speaker signal has frequency-amplitude spectrum which is as flat as practically achievable from the resonant frequency up to an upper limit frequency.

The speaker feed which drives the speaker to have the frequency response of curve A (of FIG. 1 or 2) can also be generated by the equalizer which generates the speaker feeds which drive the speaker to have the frequency response of curves B, C, and D. In this case, the input signal to the equalizer has maximum output level at each frequency in the full range indicated in FIG. 1, and the equalizer would not modify (e.g., boost) frequency components of the input signal at frequencies below the resonant frequency (since the input signal is already sufficient to drive the speaker at frequencies below the resonant frequency at maximum output level and without over-excursion), and would equalize the input at frequencies above the resonant frequency as necessary to generate an equalized speaker feed sufficient to drive the speaker (at frequencies above the resonant frequency up to an upper limit frequency) with a flat (or substantially flat) frequency response, at maximum output level without over-excursion. When the speaker is driven by the equalized speaker feed, the output level at each frequency in the range from resonance down to the minimum frequency, $F_{min}$, would fall with decreasing frequency at a rate which is equal (or substantially equal) to a 2-pole rate.

In FIG. 2, curve A coincides with curve B from sub-resonance frequency $F_1$ down to sub-resonance frequency $F_2$ (i.e., segment A2 of curve A coincides with segment B1 of curve B, as indicated in FIG. 2). Curve A coincides with each of curves B and C from the frequency $F_2$ down to sub-resonance frequency $F_3$ (so that segment B2 of curve B and segment C1 of curve C coincide with segment A3 of curve A, as indicated in FIG. 2). Curve D coincides with each of curves A, B, and C from frequency $F_3$ down to frequency $F_{min}$ (so that segment D1 of curve D, segment B3 of curve B, and segment C2 of curve C, coincide with segment A4 of curve A, as indicated in FIG. 2).

In FIG. 2, segments B1, B2, and B3 of curve B (the portion of curve B below its sub-resonance equalization band) indicate, and segments C1 and C2 of curve C (the portion of curve C below its sub-resonance equalization band) indicate, and segment D1 of curve D (the portion of curve D below its sub-resonance equalization band) indicates maximum output level of the speaker (the maximum sound pressure level that can be emitted without causing over-excursion of the speaker) as a function of frequency from the lower frequency limit of the sub-resonance equalization band down to minimum frequency, $F_{min}$. In the case that the speaker is a sealed speaker, this maximum output level falls (with decreasing frequency from the lower frequency limit of the sub-resonance equalization band down to the minimum frequency) at a natural rate which is at least substantially equal to a 2-pole rate.

The speaker can be driven to have a frequency response (below its resonant frequency) matching the corresponding portion of the frequency-amplitude spectrum of curve A of FIG. 2, by a speaker feed whose frequency components (for frequencies below the resonant frequency) have the same peak amplitude, where such peak amplitude is maximal in the sense that the frequency component can drive the speaker to emit sound with the maximum sound pressure level that can be emitted without causing over-excursion of the speaker. Similarly, the speaker can be driven to have a frequency response, at frequencies below the sub-resonance equalization band of curve B (or C or D), matching the corresponding portion of the frequency-amplitude spectrum of curve B (or C or D), by a speaker feed whose frequency components (for frequencies below the sub-resonance equalization band) have the same peak amplitude, where such peak amplitude is maximal in the sense that the frequency component can drive the speaker to emit sound with the maximum sound pressure level that can be emitted without causing over-excursion of the speaker.

Each of curves A, B, C, and D assumes that the speaker is driven at frequencies above the resonant frequency by an equalized speaker feed, to emit sound having frequency-amplitude spectrum which is flat as a function of frequency (at frequencies above the resonant frequency). Curve A assumes that the equalized speaker feed has a frequency component having peak level (at each indicated frequency above the resonant frequency) which is maximal in the sense that it causes the speaker to emit sound with the maximum sound pressure level (e.g., that indicated as "Maximum Level" in curve A) that can be emitted without causing over-excursion of the speaker. Curve B assumes that the equalized speaker feed has a frequency component (at each indicated frequency above the resonant frequency) having a peak amplitude that is less than maximal. Curve C assumes that the equalized speaker feed has a frequency component (at each frequency above the resonant frequency) having a peak amplitude that is less than that of the speaker feed of curve B for the same frequency. Curve D assumes that the equalized speaker feed has a frequency component (at each indicated frequency above the resonant frequency) having a peak amplitude that is less than that of the speaker feed of curve C for the same frequency.

When a sealed speaker is driven by a speaker feed whose frequency components are maximal in the sense that each causes the speaker to emit sound with the maximum sound pressure level that can be emitted without over-excursion (e.g., a speaker feed for driving the speaker with a response corresponding to curve A of FIG. 2), the best possible frequency response of the speaker is typically considered to be one that is essentially flat down to resonance and then falls at a rate equal (or substantially equal) to a 2-pole rate with falling frequency (i.e., one having the shape of curve A). However, when such speaker is driven by a speaker feed whose frequency components are less than maximal in the sense that each causes the speaker to emit sound with less than the maximum sound pressure level that can be emitted without over-excursion (e.g., a speaker feed for driving the speaker with a response corresponding to curve B, C, or D), the inventor has recognized that the speaker feed can be equalized (including by undergoing boosting at frequencies in a range below the resonant frequency) and the speaker can be driven by the equalized (boosted) speaker feed to accurately reproduce frequencies lower than the resonant frequency without reaching over-excursion. For example, if the bass components from a broadband speaker feed are 12 dB below maximum output (i.e., each bass component is 12 dB below the amplitude that would cause a sealed speaker to reach over-excursion), this bass can be reproduced down to an octave below the system's resonant frequency. The inventor has recognized that if such broadband speaker feed is equalized (including by boosting bass components in an appropriately determined band of sub-resonant frequencies), and the speaker can be driven by the equalized speaker feed to reproduce the boosted bass without reaching over-excursion.

If a sealed speaker is being driven at a level which is low enough that the speaker is able (without reaching over-excursion) to reproduce signals down to some minimum frequency, Fc (e.g., a frequency Fc equal to frequency $F_{min}$ of FIG. 2), the inventor has recognized that an equalizer can be employed to achieve an at least substantially flat response from above the speaker's resonance frequency down to Fc, if the equalizer (e.g., implemented as an biquadratic IIR filter) implements a biquadratic function with a complex pair of poles at a controllable frequency (so that the equalizer can be controlled to set this frequency to Fc or any of a plurality of frequencies greater than Fc), and a complex pair of zeros chosen to cancel exactly the poles that form the speaker system's primary resonance. Accordingly, in methods, apparatus and systems according to typical embodiments of the present invention equalizing the input signal to generate the speaker feed may include implementing a biquadratic function with a complex pair of poles at a controllable frequency and a complex pairs of zeros chosen to at least substantially cancel the poles that form the speaker's resonance. The biquadratic function may further have an appropriate quality factor Q (e.g., $Q=0.7071=1/\sqrt{2}$). When the controllable frequency of the pole pair is set to be Fc, the equalizer is operable to boost sub-resonance frequencies of an input speaker feed (to generate an equalized speaker feed) such that the resulting overall response (of the speaker to the equalized speaker feed) is substantially flat down to Fc, and then rolls off (with decreasing frequency below Fc) at 12 dB/octave. As the level required of the system increases (i.e., as the speaker feed level, and thus the excursion of the speaker driven by the speaker feed, increases), it is necessary to control the equalizer to increase the controllable frequency of the equalizer's pole pair to a frequency Fc' (where Fc' is greater than Fc) to prevent the speaker from being driven to exceed its excursion limit(s). In typical embodiments of the invention, the frequency Fc' is the lower frequency limit, or cutoff frequency, of the inventive sub-resonance equalization band for the corresponding speaker feed level (and speaker excursion value). When the controllable frequency of the pole pair is set to be Fc', the equalizer can operate to boost sub-resonance frequencies of an input speaker feed (to generate an equalized speaker feed) such that the resulting overall response (of the speaker to the equalized speaker feed) is substantially flat down to Fc', and then rolls off (with decreasing frequency below Fc) at 12 dB/octave. Accordingly, in typical embodiments of the invention, the controllable frequency is set to the cutoff frequency. In general, the controllable frequency may be adjusted based on the feedback signal.

In typical embodiments, the equalizer's variable pole pair frequency is adjusted as follows. A feedback system is employed which measures a signal proportional to speaker displacement (excursion) within the spring-loaded region of the speaker's operation, and uses this signal as a feedback signal to adjust the equalizer's pole pair frequency to generate an output for driving the speaker such that the excursion limit is not exceeded.

FIG. 3 is a block diagram of an embodiment of a system including sealed speaker 13 and equalizer 1, where equalizer 1 is an example of an equalizer configured in accordance with an embodiment of the invention to generate an output (of the type described in the previous paragraph) for driving speaker 13.

In the FIG. 3 embodiment, equalizer 1 is configured to equalize an input signal (an unequalized speaker feed) to generate an output signal (an equalized speaker feed). The output signal is asserted to speaker 13, and drives speaker 13 with an equalized response including a sub-resonance equalization band (e.g., of one of the types described herein). Speaker 13 is a sealed speaker (or another speaker having a slow falloff, e.g., a falloff at a 2-pole rate, from its resonance frequency down to a minimum frequency, $F_{min}$). Equalizer 1 includes equalization filter 3 (an equalization subsystem of equalizer 1, having an input coupled to receive the input signal, which is an unequalized speaker feed), and a control subsystem (a feedback signal generation subsystem comprising detector filter 5, level detector 7, comparator 9, and smoothing filter 11, coupled as shown). The control subsystem is coupled and configured to control the parameters of filter 3 (i.e., to determine an equalization setting of filter 3) in response to feedback generated by the control subsystem. The feedback is generated by filter 11 and asserted from element 11 to filter 3. In operation, a typical implementation of filter 3 operates (as a sliding band equalizer which boosts frequency components of an input signal in a sliding, sub-resonance frequency band having a sliding, feedback-determined, cutoff frequency) at the feedback-determined setting to generate the output such that the output is a speaker feed suitable for driving speaker 13 with an equalized response which is at least substantially flat in the sub-resonance equalization band, where the low frequency limit (cutoff frequency) of the sub-resonance equalization band is set to be as low as possible subject to the constraint that speaker 13 does not reach over-excursion when driven by the output. In some implementations, elements 3, 5, 7, 9, and 11 operate in the frequency domain (with element 3 operating on frequency components of a frequency-domain representation of the input signal), to determine a frequency-domain representation of the output signal (in response to which a time-domain output signal may be generated, by a subsystem not explicitly shown in FIG. 3, for assertion to speaker 13). In some alternative implementations, elements 3, 5, 7, 9, and 11 operate in the time domain (with element 3 operating on a time-domain input signal), to determine a time-domain output signal for assertion to speaker 13.

In a typical embodiment, equalization filter 3 is implemented as a variable-pole biquadratic IIR filter for generating the output signal for driving speaker 13. Speaker 13 has a known resonance frequency, a known minimum output level (where the minimum output level is sufficiently low that at the minimum output level, the speaker is able to reproduce, without reaching over-excursion, signals down to a known minimum frequency, $F_{min}$), and a known maximum output level (the maximum sound pressure level of sound that can be emitted from the speaker without driving the speaker into over-excursion). In this embodiment, filter 3 can be employed to generate the output signal so that the output signal is suitable for driving the speaker with an at least substantially flat response from above the speaker's resonance frequency down to $F_{min}$. In the embodiment, filter 3 implements a biquadratic function with a complex pair of poles at a controllable frequency, Fc' (where Fc' can be set to be equal to $F_{min}$, or to any of a plurality of frequencies greater than $F_{min}$ but not greater than the resonance frequency), an appropriate quality factor Q (e.g., Q=0.7071=1/√2), and a complex pair of zeros chosen to cancel exactly the poles that form the speaker's primary resonance. When the controllable frequency, Fc', of the pole pair is set to be $F_{min}$, and the input signal level corresponds to the minimum output level, the equalizer can operate to boost sub-resonance frequencies of the input signal (an unequalized speaker feed) to generate the output signal (an equalized speaker feed) such that the resulting overall response (of the speaker to the equalized speaker feed) is substantially flat down to $F_{min}$, and then rolls off (with decreasing frequency below $F_{min}$) at 12 dB/octave. As the level required of the system increases above the minimum output level (and thus as the input signal level increases, and the excursion of the speaker driven by filter 3's output signal increases), it is necessary to control filter 3 to increase the controllable frequency of the pole pair to a frequency greater than $F_{min}$ to prevent the speaker from being driven to exceed its excursion limit(s). In typical embodiments of the invention, when the controllable frequency of the pole pair is set to be a frequency Fc' which is less than the resonance frequency, the frequency Fc' is the lower frequency limit, or cutoff frequency, of the inventive sub-resonance equalization band for the corresponding speaker feed level (and speaker excursion value). When the controllable frequency of the pole pair is set to this frequency, Fc', the equalizer can operate to boost sub-resonance frequencies of an input speaker feed (to generate an equalized speaker feed) such that the resulting overall response (of the speaker to the equalized speaker feed) is substantially flat down to Fc', and then rolls off (with decreasing frequency below Fc) at 12 dB/octave.

In typical embodiments, the controllable pole pair frequency of filter 3 is adjusted as follows. The feedback signal which is output from element 11 is proportional to speaker displacement (excursion) within the spring-loaded region of speaker 13's operation. The controllable pole pair frequency, Fc', of filter 3 is set to a value determined by the feedback signal, to cause the equalizer to generate an output for driving the speaker such that the speaker does not reach over-excursion.

In a typical implementation of equalizer 1 of FIG. 3:

detector filter 5 is a low pass filter (e.g., a second order low pass filter) configured to pass to level detector 7 only sub-resonance frequencies (e.g., frequency components) of the output signal. For example, filter 5 may be configured to pass only frequency components of the output signal in a range from speaker 13's resonant frequency (or a sub-resonance frequency somewhat below speaker 13's resonant frequency) down to some minimum frequency (e.g., the minimum frequency of speaker 13's spring-loaded region);

level detector 7 is coupled and configured to identify the peak level of the output signal in the frequency range passed by filter 5 (e.g., the absolute value of largest-amplitude frequency component of the output signal in this frequency range);

comparator 9 is coupled and configured to compare the peak level determined by detector 7 with a reference level, and to generate a normalized signal in response to the peak level determined by detector 7 or the reference level, whichever is greater. The normalized signal is indicative of a value equal to N=G-R, where G is the greater one of the peak level determined by detector 7 and the reference level, and R is the reference level. The normalized signal is asserted to smoothing filter 11. When the peak level (determined by detector 7) exceeds the reference level, the normalized signal value (N) is zero. When reference level exceeds the peak level (determined by detector 7), the normalized signal value (N) is greater than zero. Each value of N corresponds to (and can set) a value of the controllable frequency of the pole pair of filter 3. For example, N=0 may correspond to the minimum value, $F_{min}$, of the controllable frequency of the pole pair, and increasing values of N (up to a value corresponding to the maximum output level of the speaker) may correspond to increasing values, Fc', of the pole pair's controllable frequency (up to a maximum value of Fc' equal to speaker 13's resonance frequency); and limiting smoothing filter 11 is configured to smooth the normalized signal asserted thereto from comparator 9 to generate a smoothed signal which is asserted (as a feedback signal) to filter 3. For example, filter 11 may generate the smoothed signal such that the smoothed signal is indicative of a sequence of smoothed values, where each of the smoothed values is an average of values of the normalized signal in a moving time window of predetermined duration. Each value of the smoothed signal corresponds to one of the values (N) of the normalized signal, and thus corresponds to (and is employed to determine) a value of the controllable frequency of the pole pair of filter 3. Thus, in a typical implementation, the cutoff frequency of the sub-resonance equalization band of filter 3 is controlled in response to (i.e., determined by) the smoothed signal such that the sub-resonance equalization band has width which is inversely proportional to peak amplitude of frequency content of the output signal in the range of sub-resonance frequencies passed by filter 5.

In some embodiments of the present invention which generate an equalized speaker feed for speaker, the speaker includes a single driver. Some other embodiments of the invention generate a single equalized speaker feed for all drivers of a speaker, where the speaker includes multiple drivers whose low-frequency characteristics match each other sufficiently closely so that all can be driven by a single speaker feed, in each of a range of output levels, without any of the drivers being driven into over-excursion.

In other embodiments of the invention, N speaker feeds (where N is an integer greater than one) are generated, each in accordance with the invention (e.g., by a different one of N instances of equalizer 1 of FIG. 3) for driving a different one of the drivers of a speaker which includes N drivers. One speaker feed is generated for each of the drivers of the multi-driver speaker. Such embodiments are appropriate where the low-frequency characteristics of the drivers in the speaker do not closely match each other.

Examples of embodiments (EEEs) of the invention include the following:

EEE 1. A method for generating a speaker feed for driving a sealed speaker having a resonance frequency, said method including steps of:

in response to the speaker feed, generating feedback indicative of excursion of the speaker; and in response to the feedback, equalizing an input signal to generate the speaker feed, such that the speaker feed is equalized for driving the speaker with:

a desired frequency response above the resonance frequency; and an at least substantially flat frequency response in a variable sub-resonance equalization band without exceeding the speaker's excursion limit, where the sub-resonance equalization band extends from the resonance frequency down to a variable cutoff frequency, and the cutoff frequency is determined in response to the feedback.

EEE 2. The method of EEE 1, wherein the feedback is indicative of peak amplitude of frequency content of the speaker feed in a range of sub-resonance frequencies of the speaker.

EEE 3. The method of EEE 2, wherein the cutoff frequency is determined in response to the feedback such that the sub-resonance equalization band has width which is a decreasing function of the peak amplitude of the frequency content of the speaker feed in said range of sub-resonance frequencies.

EEE 4. The method of EEE 3, wherein the cutoff frequency is determined in response to the feedback such that the sub-resonance equalization band has width which is inversely proportional to the peak amplitude of the frequency content of the speaker feed in said range of sub-resonance frequencies.

EEE 5. The method of any of EEEs 1, 2, 3, or 4, wherein said step of equalizing the input signal includes boosting the input signal at frequencies in the sub-resonance equalization band.

EEE 6. The method of EEE 5, wherein said step of boosting the input signal at frequencies in the sub-resonance equalization band is performed such that the boost has a sloping frequency-amplitude response which at least substantially cancels natural falloff of the speaker's frequency response below the resonance frequency.

EEE 7. The method of any of EEEs 1, 2, 3, 4, 5, or 6, wherein the desired frequency response above the resonance frequency is at least substantially flat above the resonance frequency up to an upper limit frequency.

EEE 8. The method of any of EEEs 1, 2, 3, 4, 5, 6, or 7, wherein the resonance frequency is at least substantially equal to 67 Hz.

EEE 9. The method of any of EEEs 1, 2, 3, 4, 5, 6, 7, or 8, wherein the sub-resonance equalization band extends at least one octave below the resonance frequency.

EEE 10. The method of EEE 1, 2, 3, 4, 5, 6, 7, or 8, wherein the sub-resonance equalization band extends at least one and one half octaves below the resonance frequency.

EEE 11. An equalizer for generating a speaker feed for driving a sealed speaker having a resonance frequency, said equalizer including:
a feedback generation subsystem, coupled and configured to generate a feedback signal indicative of excursion of the speaker in response to the speaker feed; and
an equalization subsystem coupled to the feedback generation subsystem, where the equalization subsystem has at least one input coupled to receive an input signal and is coupled and configured to equalize the input signal to generate the speaker feed in response to the feedback signal, such that the speaker feed is equalized for driving the speaker with:
a desired frequency response above the resonance frequency; and
an at least substantially flat frequency response in a variable sub-resonance equalization band without exceeding the speaker's excursion limit, where the sub-resonance equalization band extends from the resonance frequency down to a variable cutoff frequency, and the cutoff frequency is determined in response to the feedback signal.

EEE 12. The equalizer of EEE 11, wherein the feedback signal is indicative of peak amplitude of frequency content of the speaker feed in a range of sub-resonance frequencies of the speaker.

EEE 13. The equalizer of EEE 12, wherein the equalization subsystem is configured to determine the cutoff frequency in response to the feedback signal such that the sub-resonance equalization band has width which is a decreasing function of the peak amplitude of the frequency content of the speaker feed in said range of sub-resonance frequencies.

EEE 14. The equalizer of any of EEEs 12, wherein the equalization subsystem is configured to determine the cutoff frequency in response to the feedback signal such that the sub-resonance equalization band has width which is inversely proportional to the peak amplitude of the frequency content of the speaker feed in said range of sub-resonance frequencies.

EEE 15. The equalizer of any of EEEs 11, 12, 13, or 14, wherein the equalization subsystem is configured to equalize the input signal including by boosting the input signal at frequencies in the sub-resonance equalization band.

EEE 16. The equalizer of EEE 15, wherein the equalization subsystem is configured to boost the input signal at frequencies in the sub-resonance equalization band such that the boost has a sloping frequency-amplitude response which at least substantially cancels natural falloff of the speaker's frequency response below the resonance frequency.

EEE 17. The equalizer of any of EEEs 11, 12, 13, 14, 15, or 16, wherein the desired frequency response above the resonance frequency is at least substantially flat above the resonance frequency up to an upper limit frequency.

EEE 18. The equalizer of any of EEEs 11, 12, 13, 14, 15, 16, or 17, wherein the resonance frequency is at least substantially equal to 67 Hz.

EEE 19. The equalizer of any of EEEs 11, 12, 13, 14, 15, 16, 17, or 18, wherein the sub-resonance equalization band extends at least one octave below the resonance frequency.

EEE 20. The equalizer of any of EEEs 11, 12, 13, 14, 15, 16, 17, or 18, wherein the sub-resonance equalization band extends at least one and one half octaves below the resonance frequency.

EEE 21. A system, including:
a sealed speaker having a resonance frequency; and
a speaker feed subsystem coupled to the speaker and configured for generating a speaker feed for driving the speaker, said speaker feed subsystem including:
a feedback generation subsystem, coupled and configured to generate a feedback signal indicative of excursion of the speaker in response to the speaker feed; and
an equalization subsystem coupled to the feedback generation subsystem, where the equalization subsystem has at least one input coupled to receive an input signal and is coupled and configured to equalize the input signal to generate the speaker feed in response to the feedback signal, such that the speaker feed is equalized for driving the speaker with:
a desired frequency response above the resonance frequency; and
an at least substantially flat frequency response in a variable sub-resonance equalization band without exceeding the speaker's excursion limit, where the sub-resonance equalization band extends from the resonance frequency down to a variable cutoff frequency, and the cutoff frequency is determined in response to the feedback signal.

EEE 22. The system of EEE 21, wherein the feedback signal is indicative of peak amplitude of frequency content of the speaker feed in a range of sub-resonance frequencies of the speaker.

EEE 23. The system of EEE 22, wherein the equalization subsystem is configured to determine the cutoff frequency in response to the feedback signal such that the sub-resonance equalization band has width which is a decreasing function of the peak amplitude of the frequency content of the speaker feed in said range of sub-resonance frequencies.

EEE 24. The system of EEE 22, wherein the equalization subsystem is configured to determine the cutoff frequency in response to the feedback signal such that the sub-resonance equalization band has width which is inversely proportional to the peak amplitude of the frequency content of the speaker feed in said range of sub-resonance frequencies.

EEE 25. The system of any of EEEs 21, 22, 23, or 24, wherein the equalization subsystem is configured to equalize the input signal including by boosting the input signal at frequencies in the sub-resonance equalization band.

EEE 26. The system of EEE 25, wherein the equalization subsystem is configured to boost the input signal at frequencies in the sub-resonance equalization band such that the boost has a sloping frequency-amplitude response which at least substantially cancels natural falloff of the speaker's frequency response below the resonance frequency.

EEE 27. The system of any of EEEs 21, 22, 23, 24, 25, or 26, wherein the desired frequency response above the resonance frequency is at least substantially flat above the resonance frequency up to an upper limit frequency.

EEE 28. The system of any of EEEs 21, 22, 23, 24, 25, 26, or 27, wherein the sub-resonance equalization band extends at least one octave below the resonance frequency.

EEE 29. The system of any of EEEs 21, 22, 23, 24, 25, 26, or 27, wherein the sub-resonance equalization band extends at least one and one half octaves below the resonance frequency.

Aspects of embodiments of the invention include methods described herein and modifications thereof and variations thereon which are within the scope of the EEEs, and a system or device configured (e.g., programmed) to perform any embodiment of the inventive method (e.g., a system which is or includes an equalization system configured to perform an embodiment of the inventive method). For example, the inventive system can be or include a programmable general purpose processor, digital signal processor, or microprocessor, programmed with software or firmware and/or otherwise configured to perform any of a variety of operations on data (including data indicative of an input, unequalized speaker feed), including an embodiment of the inventive method or steps thereof. Such a general purpose processor may be or include a computer system including an input device, a memory, and processing circuitry programmed (and/or otherwise configured) to perform an embodiment of the inventive method (or steps thereof) in response to data asserted thereto.

A number of embodiments of the invention have been described. It should be understood that various modifications may be made without departing from the spirit and scope of the invention. Numerous modifications and variations of embodiments of the present invention are possible in light of the above teachings. It is to be understood that within the scope of the appended claims, embodiments of the invention may be practiced otherwise than as specifically described herein.

What is claimed is:

1. A method for generating a speaker feed for driving a sealed speaker having a resonance frequency, said method including steps of:
   in response to the speaker feed, generating feedback indicative of excursion of the speaker; and
   in response to the feedback, equalizing an input signal to generate the speaker feed, such that the speaker feed is equalized for driving the speaker with:
      a desired frequency response above the resonance frequency; and
      an at least substantially flat frequency response in a variable sub-resonance equalization band without exceeding the speaker's excursion limit, where the sub-resonance equalization band extends from the resonance frequency down to a variable cutoff frequency, and the cutoff frequency is determined in response to the feedback, wherein the feedback is indicative of peak amplitude of frequency content of the equalized speaker feed in a range of sub-resonance frequencies of the speaker and wherein the cutoff frequency is determined in response to the feedback such that the sub-resonance equalization band has a width which is a decreasing function of the peak amplitude of the frequency content of the speaker feed in said range of sub-resonance frequencies.

2. The method of claim 1, wherein the cutoff frequency is determined in response to the feedback such that the sub-resonance equalization band has width which is inversely proportional to the peak amplitude of the frequency content of the speaker feed in said range of sub-resonance frequencies.

3. The method of claim 1, wherein said step of equalizing the input signal includes boosting the input signal at frequencies in the sub-resonance equalization band.

4. The method of claim 3, wherein said step of boosting the input signal at frequencies in the sub-resonance equalization band is performed such that the boost has a sloping frequency-amplitude response below the resonance frequency.

5. The method of claim 1, wherein the desired frequency response above the resonance frequency is at least substantially flat above the resonance frequency up to an upper limit frequency.

6. The method of claim 1, wherein equalizing the input signal to generate the speaker feed includes:
   implementing a biquadratic function with a complex pair of poles at a controllable frequency and a complex pairs of zeros; and
   setting the controllable frequency to the cutoff frequency.

7. The method of claim 6, further comprising:
   adjusting the controllable frequency based on the feedback signal.

8. The method of claim 1, wherein the sub-resonance equalization band extends at least one octave below the resonance frequency.

9. The method of claim 1, wherein the sub-resonance equalization band extends at least one and one half octaves below the resonance frequency.

10. An equalizer for generating a speaker feed for driving a sealed speaker having a resonance frequency, said equalizer including:
    a feedback generation subsystem, coupled and configured to generate a feedback signal indicative of excursion of the speaker in response to the speaker feed; and
    an equalization subsystem coupled to the feedback generation subsystem, where the equalization subsystem has at least one input coupled to receive an input signal and is coupled and configured to equalize the input signal to generate the speaker feed in response to the feedback signal, such that the speaker feed is equalized for driving the speaker with:
       a desired frequency response above the resonance frequency; and
       an at least substantially flat frequency response in a variable sub-resonance equalization band without exceeding the speaker's excursion limit, where the sub-resonance equalization band extends from the resonance frequency down to a variable cutoff frequency, and the cutoff frequency is determined in response to the feedback signal, wherein the feedback signal is indicative of peak amplitude of frequency content of the equalized speaker feed in a range of sub-resonance frequencies of the speaker and wherein the equalization subsystem is configured to determine the cutoff frequency in response to the feedback signal such that the sub-resonance equalization band has a width which is a decreasing function of the peak amplitude of the frequency content of the speaker feed in said range of sub-resonance frequencies.

11. The equalizer of claim 10, wherein the equalization subsystem is configured to determine the cutoff frequency in response to the feedback signal such that the sub-resonance equalization band has width which is inversely proportional to the peak amplitude of the frequency content of the speaker feed in said range of sub-resonance frequencies.

12. The equalizer of claim 10, wherein the equalization subsystem is configured to equalize the input signal including by boosting the input signal at frequencies in the sub-resonance equalization band.

13. The equalizer of claim 12, wherein the equalization subsystem is configured to boost the input signal at frequencies in the sub-resonance equalization band such that the boost has a sloping frequency-amplitude response below the resonance frequency.

14. The equalizer of claim 10, wherein the desired frequency response above the resonance frequency is at least substantially flat above the resonance frequency up to an upper limit frequency.

15. The equalizer of claim 10, wherein
the equalization subsystem implements a biquadratic function with a complex pair of poles at a controllable frequency and a complex pairs of zeros; and
the equalization subsystem is configured to set the controllable frequency to the cutoff frequency.

16. The equalizer of claim 15, wherein the equalization subsystem is further configured to adjust the controllable frequency based on the feedback signal.

17. The equalizer of claim 10, wherein the sub-resonance equalization band extends at least one octave below the resonance frequency.

18. The equalizer of claim 10, wherein the sub-resonance equalization band extends at least one and one half octaves below the resonance frequency.

19. A system, including:
a sealed speaker having a resonance frequency; and
the equalizer of claim 10,
wherein the equalizer is coupled to the speaker and configured for generating a speaker feed for driving the speaker.

20. A system, including:
a sealed speaker having a resonance frequency; and
a speaker feed subsystem coupled to the speaker and configured for generating a speaker feed for driving the speaker, said speaker feed subsystem including:
a feedback generation subsystem, coupled and configured to generate a feedback signal indicative of excursion of the speaker in response to the speaker feed; and
an equalization subsystem coupled to the feedback generation subsystem, where the equalization subsystem has at least one input coupled to receive an input signal and is coupled and configured to equalize the input signal to generate the speaker feed in response to the feedback signal, such that the speaker feed is equalized for driving the speaker with:
a desired frequency response above the resonance frequency; and
an at least substantially flat frequency response in a variable sub-resonance equalization band without exceeding the speaker's excursion limit, where the sub-resonance equalization band extends from the resonance frequency down to a variable cutoff frequency, and the cutoff frequency is determined in response to the feedback signal, wherein the feedback signal is indicative of peak amplitude of frequency content of the equalized speaker feed in a range of sub-resonance frequencies of the speaker and wherein the equalization subsystem is configured to determine the cutoff frequency in response to the feedback signal such that the sub-resonance equalization band has a width which is a decreasing function of the peak amplitude of the frequency content of the speaker feed in said range of sub-resonance frequencies.

21. The system of claim 20, wherein the equalization subsystem is configured to determine the cutoff frequency in response to the feedback signal such that the sub-resonance equalization band has width which is inversely proportional to the peak amplitude of the frequency content of the speaker feed in said range of sub-resonance frequencies.

22. The system of claim 19, wherein the equalization subsystem is configured to equalize the input signal including by boosting the input signal at frequencies in the sub-resonance equalization band.

23. The system of claim 22, wherein the equalization subsystem is configured to boost the input signal at frequencies in the sub-resonance equalization band such that the boost has a sloping frequency-amplitude response below the resonance frequency.

24. The system of claim 19, wherein the desired frequency response above the resonance frequency is at least substantially flat above the resonance frequency up to an upper limit frequency.

25. The system of claim 19, wherein
the equalization subsystem implements a biquadratic function with a complex pair of poles at a controllable frequency and a complex pairs of zeros; and
the equalization subsystem is configured to set the controllable frequency to the cutoff frequency.

26. The system of claim 25, wherein the equalization subsystem is further configured to adjust the controllable frequency based on the feedback signal.

27. The system of claim 19, wherein the sub-resonance equalization band extends at least one octave below the resonance frequency.

28. The system of claim 19, wherein the sub-resonance equalization band extends at least one and one half octaves below the resonance frequency.

* * * * *